US011632079B2

United States Patent
Ji et al.

(10) Patent No.: US 11,632,079 B2
(45) Date of Patent: Apr. 18, 2023

(54) OSCILLATING CIRCUIT

(71) Applicant: CHANGXIN MEMORY TECHNOLOGIES, INC., Hefei (CN)

(72) Inventors: Rumin Ji, Hefei (CN); Haining Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 16 days.

(21) Appl. No.: 17/479,175

(22) Filed: Sep. 20, 2021

(65) Prior Publication Data

US 2022/0077821 A1    Mar. 10, 2022

Related U.S. Application Data

(63) Continuation of application No. PCT/CN2021/103780, filed on Jun. 30, 2021.

(30) Foreign Application Priority Data

Sep. 8, 2020   (CN) .......................... 202010943869.5

(51) Int. Cl.
*H03B 5/04*   (2006.01)
*H03B 5/12*   (2006.01)

(52) U.S. Cl.
CPC .............. *H03B 5/04* (2013.01); *H03B 5/1271* (2013.01); *H03B 2200/0038* (2013.01)

(58) Field of Classification Search
CPC ...................................................... H03B 5/04
USPC ........................................................ 331/186
See application file for complete search history.

(56) References Cited

U.S. PATENT DOCUMENTS

| 5,440,277 | A   | * | 8/1995 | Ewen ....................... G05F 3/205 |
| | | | | 327/543 |
| 7,015,766 | B1  | * | 3/2006 | Guo ......................... H03K 5/133 |
| | | | | 331/185 |
| 7,391,274 | B2  |   | 6/2008 | Hsu |
| 7,663,447 | B2  | * | 2/2010 | Matsuzaki .......... H01L 27/1214 |
| | | | | 455/75 |
| 8,508,307 | B2  |   | 8/2013 | Mitsuda |
| 8,922,289 | B2  |   | 12/2014| Mitsuda et al. |
| 10,530,297| B2  |   | 1/2020 | Zhang et al. |
| 10,797,643| B2  |   | 10/2020| Kuwano et al. |
| 11,025,234| B1  | * | 6/2021 | Chakraborty ........ H03K 3/0322 |
| 2002/0000886 | A1 | * | 1/2002 | Ichihara ................ H03K 3/011 |
| | | | | 331/186 |
| 2006/0226921 | A1 |   | 10/2006| Hsu |

(Continued)

FOREIGN PATENT DOCUMENTS

CN    1713513 A    12/2005
CN    202268843 U   6/2012
(Continued)

*Primary Examiner* — Joseph Chang
(74) *Attorney, Agent, or Firm* — Cooper Legal Group, LLC

(57) ABSTRACT

An oscillating circuit comprises a constant voltage supply circuit, a constant current supply circuit and an oscillating circuit; the constant voltage supply circuit is configured to output constant voltage; the constant current supply circuit is configured to output constant current; and the oscillating circuit is connected to the constant voltage supply circuit and the constant current supply circuit, and is configured to generate an oscillating signal with a preset frequency according to the constant voltage and the constant current.

14 Claims, 5 Drawing Sheets

(56) References Cited

U.S. PATENT DOCUMENTS

| | | |
|---|---|---|
| 2011/0316515 A1 | 12/2011 | Mitsuda |
| 2013/0293313 A1 | 11/2013 | Mitsuda et al. |
| 2018/0351509 A1 | 12/2018 | Zhang et al. |
| 2019/0199287 A1 | 6/2019 | Kuwano et al. |
| 2020/0021249 A1 | 1/2020 | Liang et al. |

FOREIGN PATENT DOCUMENTS

| | | |
|---|---|---|
| CN | 102788647 A | 11/2012 |
| CN | 106059498 A | 10/2016 |
| CN | 108988826 A | 12/2018 |
| CN | 110011642 A | 7/2019 |
| CN | 210431350 U | 4/2020 |
| JP | 2012010262 A | 1/2012 |

* cited by examiner

OSCILLATING CIRCUIT

CROSS-REFERENCE TO RELATED APPLICATIONS

The application is a continuation of International Patent Application No. PCT/CN2021/103780, filed on Jun. 30, 2021, which is based on and claims priority to Chinese patent application No. 202010943869.5, filed on Sep. 8, 2020 and entitled "Oscillating Circuit". The disclosures of International Patent Application No. PCT/CN2021/103780 and Chinese patent application No. 202010943869.5 are hereby incorporated by reference in their entireties.

BACKGROUND

An oscillating circuit is widely used in the field of electronic science and technique, such as a carrier oscillator of a transmitter in a communication system, a local oscillator in a receiver and a signal source in a medical instrument and a measuring instrument.

A commonly used oscillating circuit may generate oscillating current based on gate delay features, the frequency of the obtained oscillating current is greatly affected by temperature, and the frequency of output oscillating current has a relatively large error when the temperature changes greatly. Therefore, an oscillating circuit, which is unaffected by temperature change and has a steady output frequency, is required to be provided.

It is to be noted that information disclosed in the above background section is merely used for enhancing understanding of the background of the present disclosure, so that information, which does not constitute the conventional art known by those ordinary skilled in the art, may be included.

SUMMARY

The present disclosure relates to the technical field of electronic circuits, and exemplarily relates to an oscillating circuit.

According to an aspect of the present disclosure, there is provided an oscillating circuit, which includes a constant voltage supply circuit, a constant current supply circuit and an oscillating circuit. The constant voltage supply circuit is configured to output constant voltage. The constant current supply circuit is configured to output constant current. The oscillating circuit is connected to the constant voltage supply circuit and the constant current supply circuit, and is configured to generate an oscillating signal with a preset frequency according to the constant voltage and the constant current.

It is to be understood that the above general descriptions and detail descriptions below are merely exemplary and explanatory, which may not limit the present disclosure.

BRIEF DESCRIPTION OF THE DRAWINGS

The drawings here, which are incorporated in and constitute a part of this specification, illustrate embodiments consistent with the present disclosure and, together with the description, serve to explain the principles of the present disclosure. It is apparent that the drawings described below are only some embodiments of the present disclosure. Other drawings may further be obtained by those ordinary skilled in the art according to these drawings without creative work.

DETAILED DESCRIPTION

Figure 1:
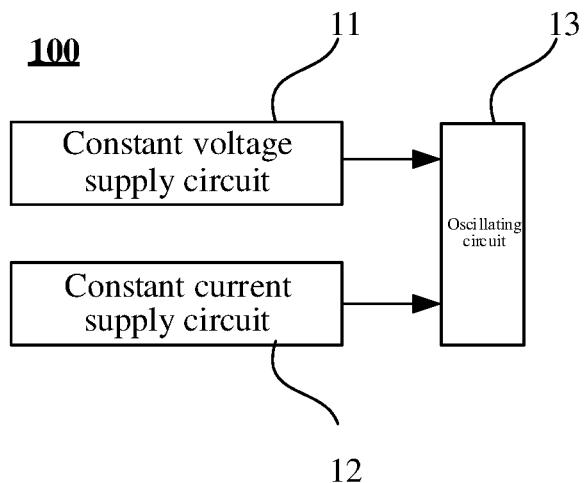
FIG. 1 is a schematic structural diagram of an oscillating circuit in an exemplary embodiment of the present disclosure.

Exemplary implementations are described more comprehensively with reference to the drawings at present. However, the exemplary implementations may be implemented in many forms, and is not be understood as limitation to examples described here. Instead, these provided implementations enable the present disclosure to be more comprehensive and complete, and conceptions of the exemplary implementations are comprehensively conveyed to those skilled in the art. The described features, structures or features may be combined in one or more implementations in any proper manner. In the descriptions below, many specific details are provided to give a full understanding of the implementations of the present disclosure. However, those skilled in the art will realize that: the technical solutions of the present disclosure may be practiced and one or more of the specific details are omitted, or other methods, components, devices, steps and the like may be adopted. In other cases, the known technical solutions are not illustrated or described in detail to avoid blurring the main concept, which results in that various aspects of the present disclosure become blurred.

Moreover, the drawings are merely schematic diagrams of the present disclosure, and same drawing signs in the figure represent same or similar parts, so that repetitive descriptions of them are omitted. Some block diagrams illustrated in the drawings are functional entities, and do not necessarily correspond to physically or logically independent entities. These functional entities may be realized in a software form, or these functional entities may be realized in one or more hardware modules or integrated circuits, or these functional entities may be realized in different networks and/or processor devices and/or micro-controller unit devices.

The exemplary implementations of the present disclosure will be described in detail below in conjunction with the drawings.

FIG. 1 is a schematic structural diagram of an oscillating circuit in an exemplary embodiment of the present disclosure.

Referring to FIG. 1, an oscillating circuit 100 may include a constant voltage supply circuit 11, a constant current supply circuit 12 and an oscillating circuit 13.

The constant voltage supply circuit 11 is configured to output constant voltage V.

The constant current supply circuit 12 is configured to output constant current I.

The oscillating circuit 13 is connected to the constant voltage supply circuit 11 and the constant current supply circuit 12, and is configured to generate an oscillating signal with a preset frequency according to the constant voltage V and the constant current I.

In the embodiments of the present disclosure, both the constant voltage V and the constant current I are unaffected by temperature, so that an oscillating signal output by the oscillating circuit 13 may overcome influence of temperature to avoid generation of output frequency change when the temperature changes greatly.

Figure 2:
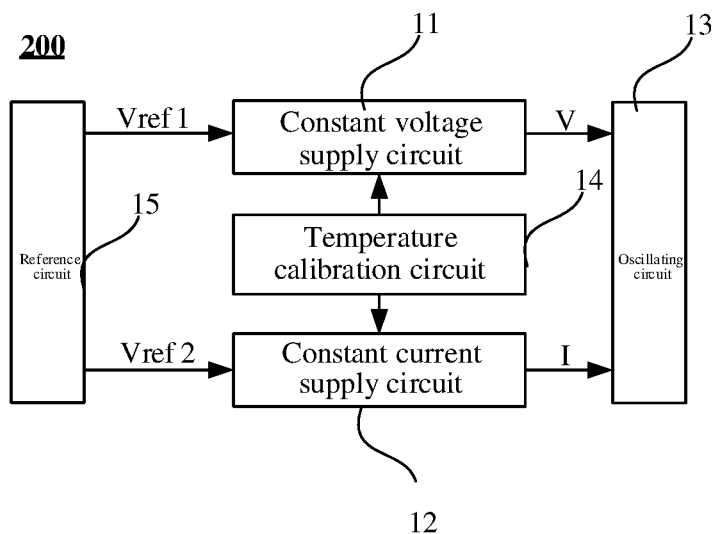
FIG. 2 is a schematic structural diagram of an oscillating circuit in another embodiment of the present disclosure.

FIG. 2 is a schematic structural diagram of an oscillating circuit in another embodiment of the present disclosure.

Referring to FIG. 2, in an embodiment, an oscillating circuit 200 may include a constant voltage supply circuit 11, a constant current supply circuit 12, an oscillating circuit 13, a temperature calibration circuit 14 and a reference circuit 15.

The constant voltage supply circuit 11 is configured to output constant voltage V.

The constant current supply circuit 12 is configured to output constant current I.

The oscillating circuit 13 is connected to the constant voltage supply circuit 11 and the constant current supply circuit 12, and is configured to generate an oscillating signal with a preset frequency according to the constant voltage and the constant current.

The temperature calibration circuit 14 is connected to the constant voltage supply circuit 11 and the constant current supply circuit 12, and is configured to detect environment temperature, and calibrate the constant voltage supply circuit 11 and the constant current supply circuit 12 according to the environment temperature.

The reference circuit 15 is configured to respectively supply first reference voltage Vref1 and second reference voltage Vref2 to the constant voltage supply circuit 11 and the constant current supply circuit 12.

In the embodiment as illustrated in FIG. 2, the constant voltage supply circuit 11 and the constant current supply circuit 12 are controlled by the temperature calibration circuit 14 to generate constant voltage V and constant current I, which are unaffected by temperature. The reference circuit 15 is configured to respectively supply reference voltage to the constant voltage supply circuit 11 and the constant current supply circuit 12. In some embodiments, the first reference voltage Vref1 supplied to the constant voltage supply circuit 11 and the second reference voltage Vref2 supplied to the constant current supply circuit 12 are equal.

According to the embodiments of the present disclosure, the temperature calibration circuit 14 is configured to perform current and voltage calibration on the oscillating circuit in the full temperature range, so that a temperature-independent oscillating signal may be obtained.

Figure 3A:
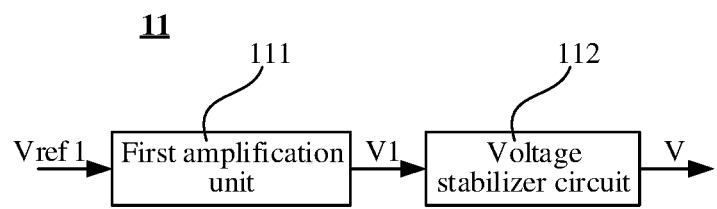
FIG. 3A is a schematic structural diagram of a constant voltage supply circuit in an embodiment of the present disclosure.

FIG. 3A is a schematic structural diagram of a constant voltage supply circuit in an embodiment of the present disclosure.

Referring to FIG. 3A, in an embodiment, the constant voltage supply circuit 11 may include a first amplification unit 111 and a voltage stabilizer circuit 112.

The first amplification unit 111 is connected to a reference circuit 15 and a temperature calibration circuit 14, and is configured to output first transition voltage V1 with a zero temperature coefficient according to first reference voltage Vref1.

The voltage stabilizer circuit 112 is connected to the first amplification unit 111, and is configured to output constant voltage V according to the first transition voltage V1.

In an embodiment, for example, the voltage stabilizer circuit 112 may be realized through a Low Dropout Regulator (LDO). An input end of the LDO is connected to an output end of the first amplification unit 111, and is configured to input the first transition voltage V1. An output end of the LDO is configured to output the constant voltage V. As for the LDO, when input voltage of the LDO is unaffected by temperature, output voltage of the LDO may also keep steady. Therefore, the first transition voltage V1 is required to be unaffected by temperature, that is, the first transition voltage is required to be a zero temperature coefficient. As an absolute zero temperature coefficient is difficultly to realize, the zero temperature coefficient in the embodiments of the present disclosure may also be a relatively small temperature coefficient close to zero, which does not affect normal operation of the circuit. For example, the temperature coefficient may be controlled in a working temperature range, and voltage change of the first transition voltage V1 affected by temperature is in the range of +1-5%.

In other embodiments, the voltage stabilizer circuit 112 may be in other forms. The present disclosure is not limited to this.

Figure 3B:
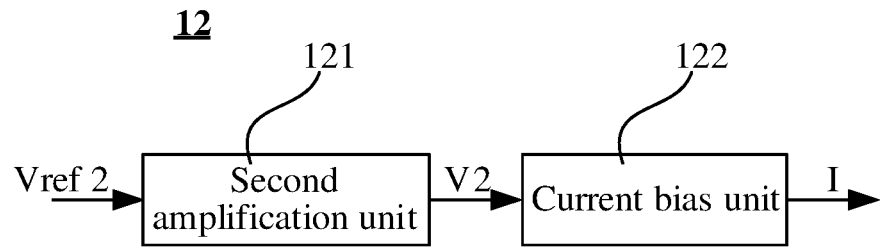
FIG. 3B is a schematic structural diagram of a constant current supply circuit in an embodiment of the present disclosure.

FIG. 3B is a schematic structural diagram of a constant current supply circuit in an embodiment of the present disclosure.

Referring to FIG. 3B, in an embodiment, the constant current supply circuit 12 may include a second amplification unit 121 and a current bias unit 122.

The second amplification unit 121 is connected to a reference circuit 15 and a temperature calibration circuit 14, and is configured to output second transition voltage V2 with a positive temperature coefficient according to second reference voltage Vref2.

The current bias unit 122 is connected to the second amplification unit 121, and is configured to output constant current I according to the second transition voltage V2.

Embodiments of circuits of the first amplification unit 111, the second amplification unit 121 and the current bias unit 122 are described below.

Figure 4:
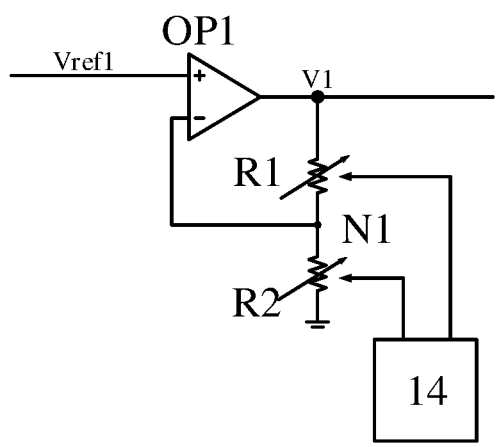
FIG. 4 is a schematic structural diagram of a first amplification circuit in an embodiment of the present disclosure.

FIG. 4 is a schematic structural diagram of a first amplification circuit in an embodiment of the present disclosure.

Referring to FIG. 4, in an embodiment, the first amplification unit 111 may include a first operator OP1.

An in-phase input end of the first operator OP1 is connected to a reference circuit 15, a reverse-phase input end of the first operator OP1 is connected to a first node N1, an output end of the first operator OP1 is connected to the first node N1 through a first resistor R1, and the first node N1 is grounded through a second resistor R2.

Herein, both the first resistor R1 and the second resistor R2 are variable resistors, control ends of the first resistor R1 and the second resistor R2 are connected to a temperature calibration circuit 14, a resistance value is controlled by the temperature calibration circuit 14, and an output end of the first amplifier OP1 is connected to an input end of a voltage stabilizer circuit 112.

As virtual short and virtual open features of an input end of an amplifier, the voltage of the first node N1 may always be equal to the first reference voltage Vref1 supplied by the reference circuit 15. The first reference voltage Vref1 may be changed by being affected by temperature, so that a temperature coefficient of the first transition voltage V1 output by an output end of the first amplifier OP1 may be adjusted by adjusting resistance values of the R1 and the R2. According to analysis of the embodiment as illustrated in FIG. 3A, the first transition voltage V1 is required to keep a zero temperature coefficient. As the temperature calibration circuit 14 adjusts values of the R1 and the R2 according to real-time temperature, i.e., a ratio of voltage (the first reference voltage Vref1) of the first node N1 to the first transition voltage V1 is adjusted, therefore, when the first reference voltage Vref1 is changed by being controlled by temperature, the temperature calibration circuit 14 may adjust the values of the R1 and the R2 according to the real-time temperature so as to keep the first transition voltage V1 basically same (for example, voltage change affected by the temperature is in the range of +/−5%), and prevent the first transition voltage V1 from being affected by the temperature, i.e., the first transition voltage V1 is kept as a zero temperature coefficient (namely a temperature coefficient close to zero in the embodiment of the present disclosure).

Figure 5:
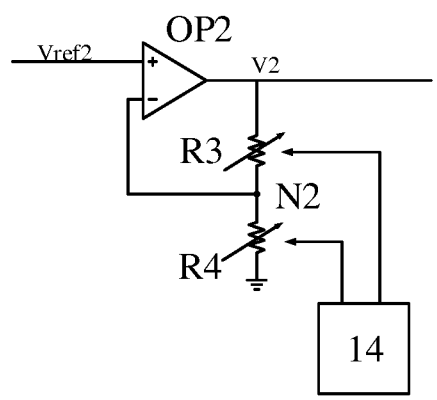
FIG. 5 is a schematic structural diagram of a second amplification circuit in an embodiment of the present disclosure.

FIG. 5 is a schematic structural diagram of a second amplification circuit in an embodiment of the present disclosure.

Referring to FIG. 5, in an embodiment, the second amplification unit 121 may include a second operator OP2.

An in-phase input end of the second operator OP2 is connected to a reference circuit 15, a reverse-phase input end of the second operator OP2 is connected to a second node N2, an output end of the second operator OP2 is connected to the second node N2 through a third resistor R3, and the second node N2 is grounded through a fourth resistor R4.

Herein, both the third resistor R3 and the fourth resistor R4 are variable resistors, control ends of the third resistor R3 and the fourth resistor R4 are connected to a temperature calibration circuit 14, a resistance value is controlled by the temperature calibration circuit 14, and an output end of the second amplifier OP2 is connected to an input end of a current bias unit 122.

As virtual short and virtual open features of an input end of an amplifier, the voltage of the second node N2 may always be equal to the second reference voltage Vref2 supplied by the reference circuit 15. The second reference voltage Vref2 may be changed by being affected by temperature, so that a temperature coefficient of the second transition voltage V2 output by an output end of the second amplifier OP2 may be adjusted by adjusting resistance values of the R3 and R4.

Figure 6:
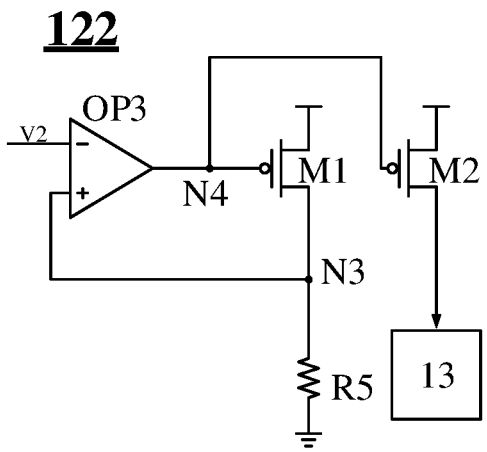
FIG. 6 is a schematic structural diagram of a current bias unit in an embodiment of the present disclosure.

According to analysis of the embodiment as illustrated in FIG. 6, a temperature coefficient of the second transition voltage V2 should be equal to a temperature coefficient of a fifth resistor R5. As the temperature calibration circuit 14 adjusts values of the R3 and the R4 according to real-time temperature, i.e., a ratio of voltage (the second reference voltage Vref2) of the second node N2 to the second transition voltage V2 is adjusted, therefore, when the second reference voltage Vref2 is changed by being controlled by temperature, the temperature calibration circuit 14 may adjust the values of the R3 and the R4 according to the real-time temperature so as to keep the temperature coefficient of the second transition voltage V2 and the temperature coefficient of the fifth resistor R5 in the current bias unit 122 below same. When the fifth resistor R5 is a positive temperature coefficient, the second transition voltage V2 is also a positive temperature coefficient.

FIG. 6 is a schematic structural diagram of a current bias unit in an embodiment of the present disclosure.

Referring to FIG. 6, in an embodiment, the current bias unit 122 may include a third amplifier OP3, a first switch M1, a second switch M2 and a fifth resistor R5.

A reverse-phase input end of the third amplifier OP3 is connected to a second amplification unit 121, an in-phase input end of the third amplifier OP3 is connected to a third node N3, and an output end of the third amplifier OP3 is connected to a fourth node N4.

A first end of the first switch M1 is connected to power supply, a second end of the first switch M1 is connected to a third node N3, and a control end of the first switch M1 is connected to a fourth node N4.

A first end of the second switch M2 is connected to the power supply, a second end of the second switch M2 is connected to an oscillating circuit 13, and a control end of the second switch M2 is connected to the fourth node N4.

A first end of the fifth resistor R5 is connected to the third node N3, and a second end of the fifth resistor R5 is grounded.

In the embodiment as illustrated in FIG. 6, the constant current I is obtained according to a ratio of the second transition voltage V2 and the fifth resistor R5 at the third node N3 by utilizing the input feature of the third amplifier OP3, thereby further constructing a current mirror structure through the first switch M1 and the second switch M2, and the constant current I is output to the oscillating circuit 13 through the second end of the second switch M2.

As the constant current I is realized based on a current mirror, a current value may be ensured to be steady. As the current value of the constant current I is obtained according to the ratio of the second transition voltage V2 and the fifth resistor R5, and the fifth resistor R5 is usually a positive temperature coefficient component, the constant current I may be kept steady when a temperature coefficient of the second transition voltage V2 is controlled to be equal to the fifth resistor R5. When the fifth resistor R5 is a negative temperature coefficient component, the second transition voltage V2 may also be controlled to be a negative temperature coefficient, and the absolute value of the temperature coefficient is equal to the absolute value of the temperature coefficient of the fifth resistor R5.

It can be seen from FIG. 4 and FIG. 5 that, both the value of the first transition voltage V1 and the second transition voltage V2 are controlled by the temperature calibration circuit 14, so that the voltage stabilizer circuit 112 and the current bias unit 122 may output steady constant voltage V and constant current I respectively.

The first reference voltage Vref1 supplied to the first amplification unit 111 by the reference circuit 15 and the second reference voltage Vref2 supplied to the second amplification unit 121 by the reference circuit 15 may be same or different. In order to simplify the circuit, the first reference voltage Vref1 and the second reference voltage Vref2 may be set to be equal, which is not specially limited in the present disclosure.

Figure 7A:
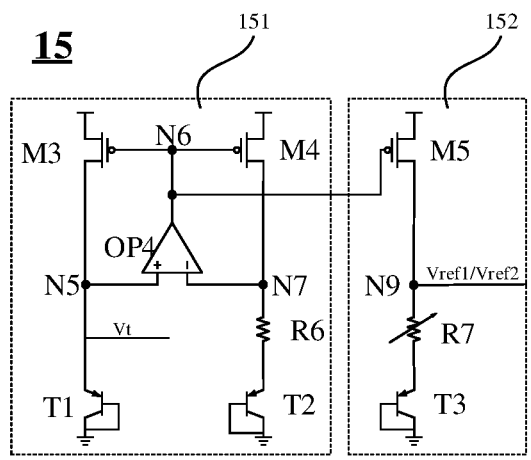
FIG. 7A is a schematic structural diagram of a reference circuit in an embodiment of the present disclosure.
Figure 7B:
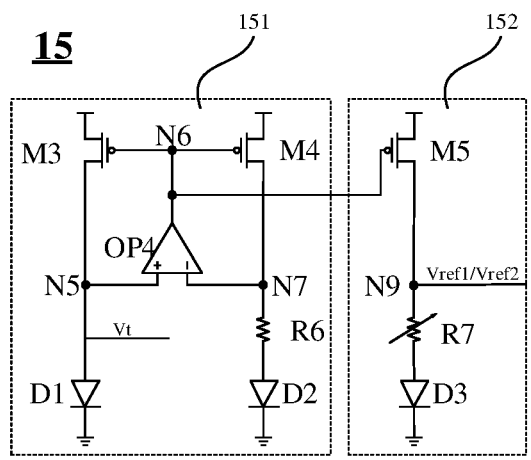
FIG. 7B is a schematic structural diagram of a reference circuit in another embodiment of the present disclosure.

FIG. 7A and FIG. 7B are schematic structural diagrams of a reference circuit in an embodiment of the present disclosure.

Referring to FIG. 7A, in an embodiment, the reference circuit 15 may include a third switch M3, a fourth switch M4, a first bipolar transistor T1, a second bipolar transistor T2, a fifth switch M5, a third bipolar transistor T3 and a fourth amplifier OP4.

A first end of the third switch M3 is connected to power supply, a second end of the third switch M3 is connected to a fifth node N5, and a control end of the third switch M3 is connected to a sixth node N6.

A first end of the fourth switch M4 is connected to the power supply, a second end of the fourth switch M4 is connected to a seventh node N7, and a control end of the fourth switch M4 is connected to the sixth node N6.

An emitter of the first bipolar transistor T1 is connected to the fifth node N5, and a collector and a base of the first bipolar transistor T1 are grounded.

An emitter of the second bipolar transistor T2 is connected to the seventh node N7 through a sixth resistor R6, and a collector and a base of the second bipolar transistor T2 are grounded.

A first end of the fifth switch M5 is connected to the power supply, a second end of the fifth switch M5 is connected to an ninth node N9, and a control end of the fifth switch M5 is connected to the sixth node N6.

An emitter of the third bipolar transistor T3 is connected to the ninth node N9 through a seventh resistor R7, and a collector and a base of the third bipolar transistor T3 are grounded.

An in-phase input end of the fourth amplifier OP4 is connected to the fifth node N5, a reverse-phase input end of the fourth amplifier OP4 is connected to the seventh node N7, and an output end of the fourth amplifier OP4 is connected to the sixth node N6.

The embodiment as illustrated in FIG. 7A is realized based on a bandgap reference circuit (Bandgap voltage reference/Bandgap). A left side part 151 of the circuit is configured to supply constant current, and a right side part 152 of the circuit is configured to output voltage less affected by temperature based on the constant current. In the embodiment as illustrated in FIG. 7A, voltage output by the ninth node N9 may be used as the first reference voltage Vref1 and the second reference voltage Vref2.

In order to keep the voltage output by the ninth node N9 steady, besides provision of constant current by using the part 151 of the circuit, impedance of the part 152 of the circuit may also be kept to be unaffected by temperature. Therefore, the seventh resistor R7 may be set as a positive temperature coefficient component, the third bipolar transistor T3 may be set as a negative temperature coefficient component, and the absolute values of the temperature coefficients of the two may be equal. When constant current output by a second end of the fifth switch M5 flows through the seventh resistor R7 and the third bipolar transistor T3, offset of voltage formed on the seventh resistor R7 and offset of voltage formed on the third bipolar transistor T3 generated by being affected by temperature may be canceled with each other, so that the ninth node N9 outputs steady voltage.

In an embodiment, in order to deal with change of constant current supplied by the 151 possibly due to the fact that the 151 circuit is affected by temperature, or overcome process errors of the seventh resistor R7 and the third bipolar transistor T3, the seventh resistor R7 may be set as an adjustable resistor, so that voltage output by the ninth node N9 may be flexibly adjusted.

It can be seen from FIG. 7A that, collectors and bases of the first bipolar transistor T1, the second bipolar transistor T2 and the third bipolar transistor T3 are grounded, that is, it is equivalent to a PN junction. Therefore, in another embodiment, functions of the bipolar transistor in FIG. 7A may be realized through a diode.

Referring to FIG. 7B, in another embodiment, the first bipolar transistor T1, the second bipolar transistor T2 and the third bipolar transistor T3 in the reference circuit 15 may be equivalently replaced by a first diode D1, a second diode D2 and a third diode D3, having same functions.

Figure 8:
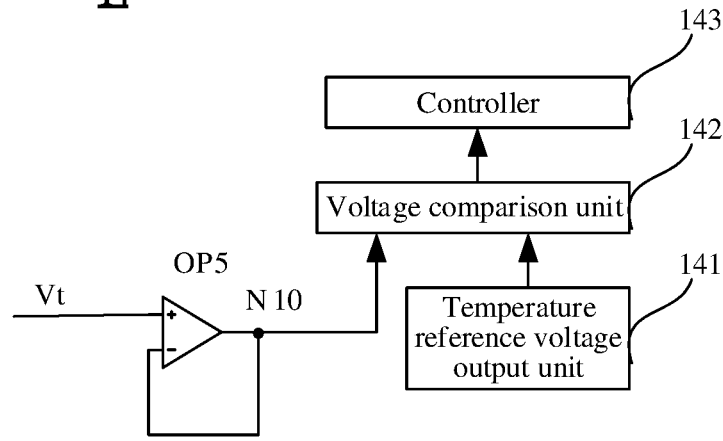
FIG. 8 is a schematic structural diagram of a temperature calibration circuit in an embodiment of the present disclosure.

FIG. 8 is a schematic structural diagram of a temperature calibration circuit in an embodiment of the present disclosure.

Referring to FIG. 8, in an embodiment, the temperature calibration circuit 14 may include a fifth amplifier OP5, a temperature reference voltage output unit 141, a voltage comparison unit 142 and a control unit 143, An in-phase input end of the fifth amplifier OP5 is connected to real-time temperature voltage Vt, and a reverse-phase input end and output end of the fifth amplifier OP5 are connected to a tenth node N10.

The temperature reference voltage output unit 141 is configured to output temperature reference voltage.

A first input end of the voltage comparison unit 142 is connected to an output end of the temperature reference voltage output unit 141, and a second input end of the voltage comparison unit 142 is connected to the tenth node N10.

The control unit 143 is connected to an output end of the voltage comparison unit 142, a constant voltage supply circuit 11 and a constant current supply circuit 12, and is configured to control the constant voltage supply circuit 11 to output constant voltage and/or control the constant current supply circuit 12 to output constant current according to an output signal of the voltage comparison unit 142.

In the embodiment as illustrated in FIG. 8, a related circuit of the fifth amplifier OP5 is configured to supply real-time temperature information, so that voltage input into an in-phase input end of the fifth amplifier OP5 may be set as voltage which is not subjected to temperature adjustment, for example, voltage at the fifth node N5 in the embodiment as illustrated in FIG. 7 is called after real-time temperature voltage Vt in the embodiment of the present disclosure.

The temperature reference voltage output unit 141 is configured to output temperature reference voltages corresponding to multiple temperatures, so that the voltage comparison unit 142 conveniently determines real-time temperature corresponding to voltage of the tenth node N10 by comparing the voltage of the tenth node N10 and multiple temperature reference voltages corresponding to multiple temperatures output by the temperature reference voltage output unit 141, thereby realizing temperature detection, and thus, the control unit 143 realizes steady output of the constant voltage V and the constant current I by adjusting the resistance values of the variable resistors in the first amplification unit 111 and the second amplification unit 121 according to the real-time temperature.

Circuit embodiments of the temperature reference voltage output unit will be described below.

Figure 9:
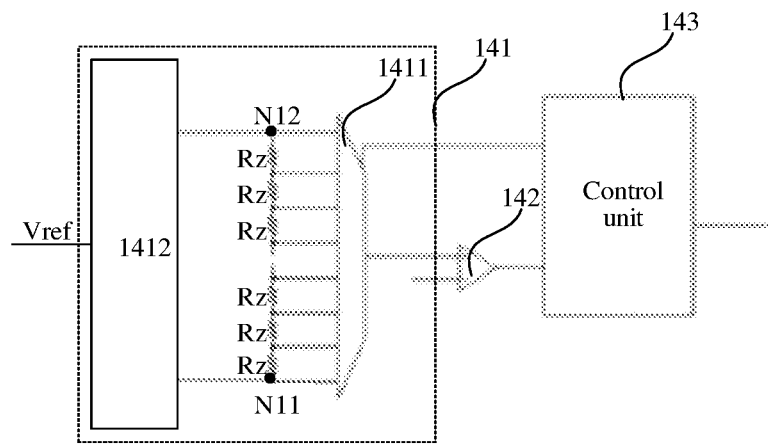
FIG. 9 is a schematic structural diagram of a temperature reference voltage output unit in an embodiment of the present disclosure.

FIG. 9 is a schematic structural diagram of a temperature reference voltage output unit in an embodiment of the present disclosure.

Referring to FIG. 9, in an embodiment, when the voltage comparison unit 142 is realized only through a comparator (called after a first comparator in the embodiment of the present disclosure), the temperature reference voltage output unit 141 may include a first multiplexer 1411 and a temperature reference signal output unit 1412.

The first multiplexer 1411 is provided with m input ends, a first input end of the first multiplexer 1411 is connected to an eleventh node N11, the m-th input end of the first multiplexer 1411 is connected to a twelfth node N12, adjacent input ends are connected through a measuring resistor Rz, the resistance value of each measuring resistor Rz is the same, and m is greater than or equal to 2.

The temperature reference signal output unit 1412 is connected to a reference voltage Vref, and is configured to output a first temperature reference signal through the eleventh node N11, and output a second temperature reference signal through the twelfth node N12, the first temperature reference signal corresponds to first temperature, and the second temperature reference signal corresponds to second temperature.

Herein, the first multiplexer 1411 is connected to a control unit 143, and is configured to output a signal of an input end to a first input end of the first comparator 142 under control of the control unit 143, and a second input end of the second comparator 142 is connected to a tenth node N10.

In the embodiment as illustrated in FIG. 9, the first temperature reference signal is higher than the second temperature reference signal. A potential difference between the eleventh node N11 and the twelfth node N12 generates current through series-connected measuring resistors, the current forms partial voltage on each measuring resistor, and voltage corresponding to each input end of the first multiplexer 1411 is the sum of partial voltage on one or more measuring resistors Rz between the input end and the eleventh node N11.

The control unit 143 outputs voltage corresponding to each input end to a first input end of the first comparator by controlling conversion of the first multiplexer 1411. When voltage output by the first multiplexer 1411 is greater than voltage of the tenth node N10, the control unit 143 detects that the first comparator outputs a first value. When voltage output by the first multiplexer 1411 is less than voltage of the tenth node N10, the control unit 143 detects that the first comparator outputs a second value. By determining a conversion node of the first value and the second value, it can be judged which voltage of an input end of the first multiplexer 1411 the tenth node N10 is closet to, so that temperature indicated by the voltage of the input end may be determined through the voltage of the input end, the first temperature reference signal and the second temperature reference signal, namely temperature indicated by the voltage of the tenth node N10.

Figure 10:
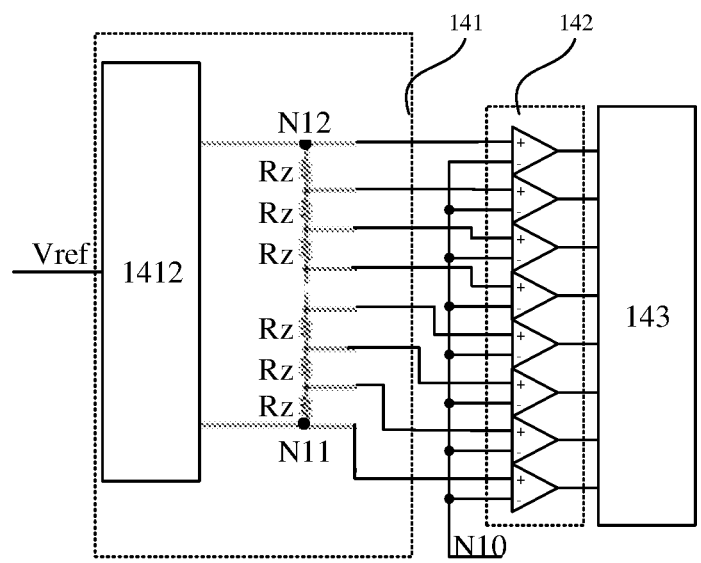
FIG. 10 is a schematic structural diagram of a temperature reference voltage output unit in another embodiment of the present disclosure.

FIG. 10 is a schematic structural diagram of a temperature reference voltage output unit in another embodiment of the present disclosure.

Referring to FIG. 10, when the voltage comparison unit is realized through m+1 comparators, the temperature reference voltage output unit 141 may include m series-connected measuring resistors Rz and a temperature reference signal output unit 1412.

The resistance value of each measuring resistor Rz is the same, a first end of the first measuring resistor Rz is connected to the eleventh node N11, a second end of the m-th measuring resistor Rz is connected to the twelfth node N12, and m is greater than or equal to 2.

The temperature reference signal output unit 1412 is connected to a reference voltage Vref, and is configured to output a first temperature reference signal through the eleventh node N11, and output a second temperature reference signal through the twelfth node N12, the first temperature reference signal corresponds to first temperature, and the second temperature reference signal corresponds to second temperature.

A first input end of each comparator is connected to a first end or second end of a measuring resistor Rz, and a second input end of each comparator is connected to the tenth node N10.

The control unit 143 sequentially reads output of each comparator, that is, which voltage between two measuring resistors the voltage of the tenth node N10 is closet to may be rapidly determined, so that temperature corresponding to voltage of the tenth node N10 may be determined.

In the embodiments as illustrated in FIG. 9 and FIG. 10, a first temperature reference signal and a second temperature reference signal are supplied through a temperature reference signal supply unit 1412, the first temperature reference signal corresponds to first temperature, the second temperature reference signal corresponds to second temperature, and the first temperature is higher than the second temperature (namely, the temperature indicated by a potential at the N11 is higher than the temperature indicated by a potential at the N12).

Figure 11:
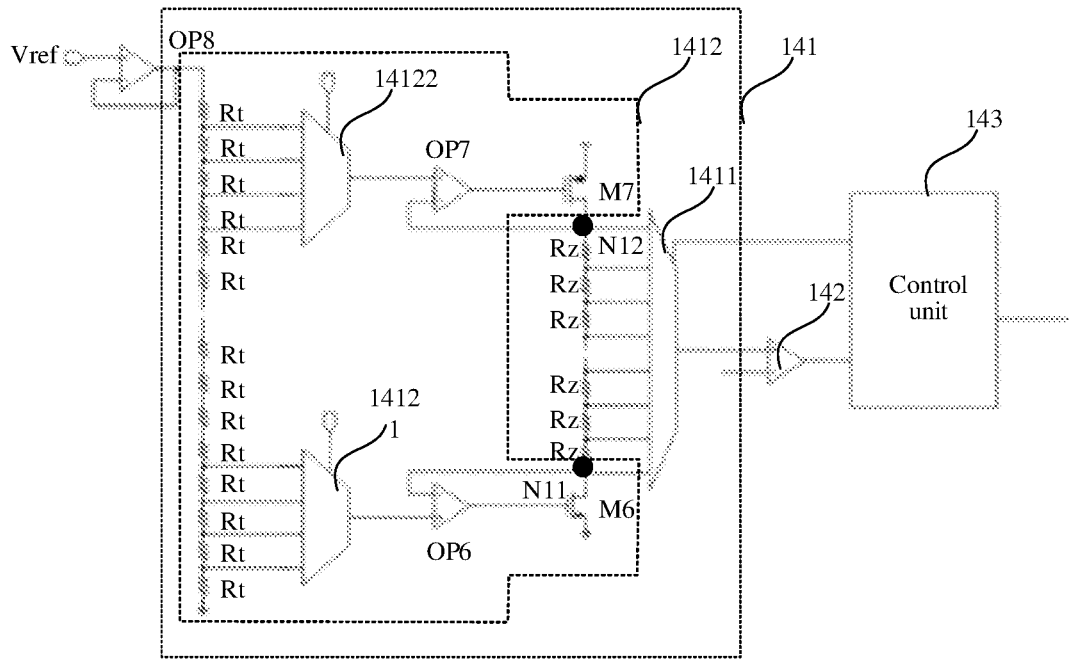
FIG. 11 is a schematic structural diagram of a temperature reference signal supply unit in an embodiment of the present disclosure.

FIG. 11 is a schematic structural diagram of a temperature reference signal supply unit in an embodiment of the present disclosure.

Referring to FIG. 11, in an embodiment, the temperature reference signal supply unit 1412 may include i series-connected constant-temperature resistors Rt, a second multiplexer 14121, a sixth amplifier OP6, a sixth switch M6, a third multiplexer 14122, a seventh amplifier OP7 and a seventh switch M7.

A second end of the first constant-temperature resistor Rt is grounded, a first end of the i-th constant-temperature resistor Rt is connected to a reference voltage Vref, and i is greater than or equal to 1.

The second multiplexer 14121 is connected to a control unit 143, and provided with j input ends, each of the input ends is connected to a first end or second end of a constant-temperature resistor Rt, and j is greater than or equal to 1.

An in-phase input end of the sixth amplifier OP6 is connected to an output end of the second multiplexer 14121, and a reverse-phase input end of the second multiplexer 14121 is connected to an eleventh node N11.

A first end of the sixth switch M6 is connected to the eleventh node N11, a second end of the sixth switch M6 is grounded, and a control end of the sixth switch M6 is connected to an output end of the sixth amplifier OP6.

The third multiplexer 14122 is connected to the control unit 143, and provided with k input ends, each of the input ends is connected to a first end or second end of a constant-temperature resistor Rt, and k is greater than or equal to 1.

An in-phase input end of the seventh amplifier OP7 is connected to an output end of the third multiplexer 14122, and a reverse-phase input end of the seventh amplifier OP7 is connected to a twelfth node N12.

A first end of the fifth switch M5 is connected to power supply, a second end of the seventh switch M7 is connected to the twelfth node N12, and a control end of the seventh switch M7 is connected to an output end of the seventh amplifier OP7.

The reference voltage Vref in the embodiments of the present disclosure is merely used for providing voltage positioning, and it may be realized by directly utilizing the first reference voltage Vref1 or the second reference voltage Vref2, and may also be realized by utilizing other voltage, which is not specially limited in the present disclosure. The reference voltage Vref may be directly input to the temperature reference signal supply unit 1412, and may also be input to the temperature reference signal supply unit 1412 through a follower formed by an eighth amplifier OP8 (as illustrated in FIG. 11), which is not specially limited in the present disclosure.

Operation modes of the second multiplexer 14121 and the third multiplexer 14122 and corresponding constant-temperature resistors Rt are the same as the embodiments as illustrated in FIG. 9, which is not elaborated herein. The voltage stabilizer circuit constructed through the sixth amplifier OP6, the seventh amplifier OP7, the sixth switch M6 and the seventh switch M7 may respectively stabilize voltage of the eleventh node N11 and voltage of the twelfth node N12 on output voltage of the second multiplexer 14121 and output voltage of the third multiplexer 14122. Output ends of the second multiplexer 14121 and the third multiplexer 14122 are adjusted by using the control unit 143, so that output voltage of the second multiplexer 14121 and output voltage of the third multiplexer 14122 are adjusted, and thus voltage of the eleventh node N11 and voltage of the twelfth node N12 are adjusted, and more flexible temperature reference signal setting is realized.

In the embodiments of the present disclosure, when a steady oscillating signal is generated by using the constant voltage V and the constant current I, an oscillating circuit generation circuit is required to be modified.

Figure 12:
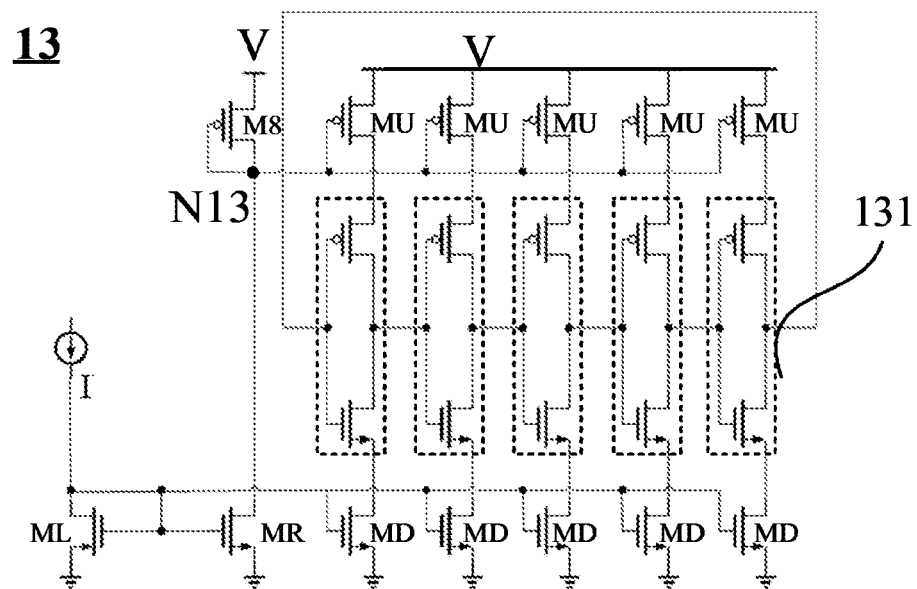
FIG. 12 is a schematic structural diagram of an oscillating circuit in an embodiment of the present disclosure.

FIG. 12 is a schematic structural diagram of an oscillating circuit in an embodiment of the present disclosure.

Referring to FIG. 12, in an embodiment, the oscillating circuit 13 may include n series-connected inverters 131, a current mirror left switch ML, a current mirror right switch MR, an eighth switch M8, n upper control switches MU and n lower control switches MD.

An output end of the n-th inverter is connected to an input end of the first inverter, herein, each of the inverters 131 may at least include an upper switch and a lower switch, both the upper switch and the lower switch are each provided with a first end, a second end and a control end, both the second end of the upper switch and the first end of the lower switch are connected to an output end of the inverter 131, both the control end of the upper switch and the control end of the lower switch are connected to an input end of the inverter 131, and n is an odd number greater than or equal to 1.

Both a first end and a control end of the current mirror left switch ML are connected to an output end of the constant current supply circuit 12, and a second end of the current mirror left switch ML is grounded.

A control end of the current mirror right switch MR is connected to an output end of the constant current supply circuit 12, a first end of the current mirror right switch MR is connected to a thirteenth node N13, and a second end of the current mirror right switch MR is grounded.

A first end of the eighth switch M8 is connected to an output end of the constant voltage supply circuit 11, and both a second end and a control end of the eighth switch M8 are connected to the thirteenth node N13.

A first end of each of the upper control switches MU is connected to an output end of the constant voltage supply circuit 11, a second end of each of the upper control switches MU is connected to a first end of the upper switch of the inverter 131, and a control end of each of the upper control switches MU is connected to the thirteenth node N13.

A first end of each of the lower control switches MD is connected to a second end of the lower switch of the inverter 131, a second end of each of the lower control switches MD is grounded, and a control end of each of the lower control switches MD is connected to an output end of the constant current supply circuit 12.

Cyclic series-connected inverters 131 supply oscillating signals. The upper control switch MU is configured to supply a steady high potential to a corresponding inverter 131 through the constant voltage V, and a control end of the lower control switch MD is controlled by the constant current I to supply a steady low potential to a corresponding inverter 131. The current mirror right switch MR is controlled by the constant current I to supply steady control current to the thirteenth node N13, so that all the upper control switches MU are controlled to output the constant voltage V.

As the constant voltage V and the constant current I, which are unaffected by temperature, are supplied to various switches in the oscillating circuit 13, the oscillating circuit 13 may output a constant oscillating signal, so that the oscillating signal output quality is improved.

It is to be noted that: although a plurality of modules or units of an apparatus for action execution are mentioned in the foregoing detailed descriptions, but this division is not mandatory. Actually, according to the implementations of the present disclosure, the foregoing described features and functions of two or more modules or units may be embodied in a module or unit. On the contrary, the foregoing described features and functions of a module or unit may further be embodied by a plurality of modules or units.

After considering the specification and practicing the present disclosure here, those skilled in the art will easily thick about other implementation schemes of the present disclosure. The application aims to contain any modification, purpose or adaptive change of the present disclosure, and these modifications, purposes or adaptive changes follow general principles of the present disclosure and may include common general knowledge or conventional technical means in the technical field, which is not disclosed by the present disclosure. The description and the embodiments are merely exemplary, and the real scope and conception of the present disclosure are pointed out by claims.

INDUSTRIAL APPLICABILITY

According to an oscillating circuit provided by the embodiments of the present disclosure, a constant voltage supply circuit and a constant current supply circuit, which are unaffected by temperature, are configured to supply constant voltage and constant current to an oscillating circuit respectively, so that change of an oscillating signal affected by temperature change may be avoided, and thus, the precision of the oscillating signal may be effectively improved.

The invention claimed is:
1. An oscillating circuit, comprising:
a constant voltage supply circuit, configured to output constant voltage;
a constant current supply circuit, configured to output constant current;
an oscillating circuit, connected to the constant voltage supply circuit and the constant current supply circuit, and configured to generate an oscillating signal with a preset frequency according to the constant voltage and the constant current; and a temperature calibration circuit, connected to the constant voltage supply circuit and the constant current supply circuit, and configured to detect environment temperature, and calibrate the constant voltage supply circuit and the constant current supply circuit according to the environment temperature.

2. The oscillating circuit of claim 1, further comprising:
a reference circuit, configured to supply first reference voltage and second reference voltage to the constant voltage supply circuit and the constant current supply circuit respectively.

3. The oscillating circuit of claim 2, wherein the first reference voltage is equal to the second reference voltage.

4. The oscillating circuit of claim 2, wherein the constant voltage supply circuit comprises:
a first amplification unit, connected to the reference circuit and the temperature calibration circuit, and configured to output first transition voltage with a zero temperature coefficient according to the first reference voltage; and
a voltage stabilizer circuit, connected to the first amplification unit, and configured to output the constant voltage according to the first transition voltage.

5. The oscillating circuit of claim 2, wherein the constant current supply circuit comprises:
a second amplification unit, connected to the reference circuit and the temperature calibration circuit, and configured to output second transition voltage with a positive temperature coefficient according to the second reference voltage; and
a current bias unit, connected to the second amplification unit, and configured to output the constant current according to the second transition voltage.

6. The oscillating circuit of claim 4, wherein the first amplification unit comprises:
a first amplifier, having an in-phase input end connected to the reference circuit, a reverse-phase input end connected to a first node, and an output end connected to the first node through a first resistor, the first node being grounded through a second resistor,
wherein each of the first resistor and the second resistor is a variable resistor and has a control end connected to the temperature calibration circuit, a resistance value of each of the first resistor and the second resistor is controlled by the temperature calibration circuit, and the output end of the first amplifier is connected to an input end of the voltage stabilizer circuit.

7. The oscillating circuit of claim 5, wherein the second amplification unit comprises:
a second amplifier, having an in-phase input end connected to the reference circuit, a reverse-phase input end connected to a second node, and an output end connected to the second node through a third resistor, and the second node being grounded through a fourth resistor;
wherein each of the third resistor and the fourth resistor is a variable resistor, and has a control end connected to the temperature calibration circuit, a resistance value of each of the third resistor and the fourth resistor is controlled by the temperature calibration circuit, and the output end of the second amplifier is connected to an input end of the current bias unit.

8. The oscillating circuit of claim 5, wherein the current bias unit comprises:
a third amplifier, having a reverse-phase input end connected to the second amplification unit, an in-phase input end connected to a third node, and an output end connected to a fourth node;
a first switch, having a first end connected to a power supply, a second end connected to the third node, and a control end connected to the fourth node;
a second switch, having a first end connected to the power supply, a second end connected to the oscillating circuit, and a control end connected to the fourth node; and
a fifth resistor, having a first end connected to the third node, and a second end which is grounded.

9. The oscillating circuit of claim 2, wherein the reference circuit comprises:
a third switch, having a first end connected to a power supply, a second end connected to a fifth node, and a control end connected to a sixth node;
a fourth switch, having a first end connected to the power supply, a second end connected to a seventh node, and a control end connected to the sixth node;
a first bipolar transistor, having an emitter connected to the fifth node, and a collector and a base that are grounded;
a second bipolar transistor, having an emitter connected to the seventh node through a sixth resistor, and a collector and a base that are grounded;
a fifth switch, having a first end connected to the power supply, a second end connected to a ninth node, and a control end connected to the sixth node;
a third bipolar transistor, having an emitter connected to the ninth node through a seventh resistor, and a collector and a base that are grounded; and
a fourth amplifier, having an in-phase input end connected to the fifth node, a reverse-phase input end connected to the seventh node, and an output end connected to the sixth node.

10. The oscillating circuit of claim 1, wherein the temperature calibration circuit comprises:
a fifth amplifier, having an in-phase input end connected to real-time temperature voltage, and a reverse-phase input end and output end that are connected to a tenth node;
a temperature reference voltage output unit, configured to output temperature reference voltage;
a voltage comparison unit, having a first input end connected to an output end of the temperature reference voltage output unit, and a second input end connected to the tenth node; and
a control unit, connected to an output end of the voltage comparison unit, the constant voltage supply circuit and the constant current supply circuit, and configured to at least one of control the constant voltage supply circuit to output the constant voltage or control the constant current supply circuit to output the constant current according to an output signal of the voltage comparison unit.

11. The oscillating circuit of claim 10, wherein the voltage comparison unit comprises a first comparator, the temperature reference voltage output unit comprises:
a first multiplexer, provided with m input ends, a first input end of the first multiplexer being connected to an eleventh node, an m-th input end of the first multiplexer being connected to a twelfth node, adjacent input ends of the first multiplexer being connected through a measuring resistor, a resistance value of each measuring resistor being the same, and m being greater than or equal to 2; and
a temperature reference signal output unit, connected to a reference voltage, and configured to output a first temperature reference signal through the eleventh node, and output a second temperature reference signal through the twelfth node, the first temperature reference signal corresponding to first temperature, and the second temperature reference signal corresponding to second temperature, wherein the first multiplexer is connected to the control unit, and is configured to output a signal of the input end of the first multiplexer to a first input end of the first comparator under control of the control unit, and a second input end of the first comparator is connected to the tenth node.

12. The oscillating circuit of claim 10, wherein the voltage comparison unit comprises m+1 comparators, the temperature reference voltage output unit comprises:

m series-connected measuring resistors, a resistance value of each measuring resistor being the same, a first end of a first measuring resistor being connected to an eleventh node, a second end of an m-th measuring resistor being connected to a twelfth node, and m being greater than or equal to 2; and a temperature reference signal output unit, connected to a reference voltage, and configured to output a first temperature reference signal through the eleventh node, and output a second temperature reference signal through the twelfth node, the first temperature reference signal corresponding to first temperature, and the second temperature reference signal corresponding to second temperature, wherein a first input end of each comparator in the voltage comparison unit is connected to a first end or second end of one measuring resistor, and a second input end of each comparator is connected to the tenth node.

13. The oscillating circuit of claim 11, wherein the temperature reference signal output unit comprises:

i series-connected constant-temperature resistors, a second end of a first constant-temperature resistor being grounded, a first end of an i-th constant-temperature resistor being connected to the reference voltage, and i being greater than or equal to 1;

a second multiplexer, connected to the control unit, and provided with j input ends, each of the input ends being connected to a first end or second end of one constant-temperature resistor, and j being greater than or equal to 1;

a sixth amplifier, having an in-phase input end connected to an output end of the second multiplexer, and a reverse-phase input end connected to the eleventh node;

a sixth switch, having a first end connected to the eleventh node, a second end which is grounded, and a control end connected to an output end of the sixth amplifier;

a third multiplexer, connected to the control unit, and provided with k input ends, each of the input ends being connected to a first end or second end of one constant-temperature resistor, and k being greater than or equal to 1;

a seventh amplifier, having an in-phase input end connected to an output end of the third multiplexer, and a reverse-phase input end connected to the twelfth node; and a seventh switch, having a first end connected to a power supply, a second end connected to the twelfth node, and a control end connected to an output end of the seventh amplifier.

14. The oscillating circuit of claim 1, wherein the oscillating circuit comprises:

n series-connected inverters, an output end of an n-th inverter being connected to an input end of a first inverter, wherein each of the inverters at least comprises an upper switch and a lower switch, both the upper switch and the lower switch are each provided with a first end, a second end and a control end, both the second end of the upper switch and the first end of the lower switch are connected to an output end of the inverter, both the control end of the upper switch and the control end of the lower switch are connected to an input end of the inverter, and n is an odd number greater than or equal to 1;

a current mirror left switch, both a first end and a control end of the current mirror left switch being connected to an output end of the constant current supply circuit, and a second end of the current mirror left switch being grounded;

a current mirror right switch, a control end of the current mirror right switch being connected to an output end of the constant current supply circuit, a first end of the current mirror right switch being connected to a thirteenth node, and a second end of the current mirror right switch being grounded;

an eighth switch, a first end of the eighth switch being connected to an output end of the constant voltage supply circuit, and both a second end and a control end of the eighth switch being connected to the thirteenth node;

n upper control switches, a first end of each of the upper control switches being connected to the output end of the constant voltage supply circuit, a second end of each of the upper control switches being connected to the first end of the upper switch of the inverter, and a control end of each of the upper control switches being connected to the thirteenth node; and n lower control switches, a first end of each of the lower control switches being connected to the second end of the lower switch of the inverter, a second end of each of the lower control switches being grounded, and a control end of each of the lower control switches being connected to the output end of the constant current supply circuit.

* * * * *